United States Patent
Tseng

(10) Patent No.: US 8,779,737 B2
(45) Date of Patent: Jul. 15, 2014

(54) VOLTAGE CONVERTING CIRCUIT AND METHOD

(75) Inventor: Kuan-Jen Tseng, Fonghua Village (TW)

(73) Assignee: Himax Analogic, Inc. (TW)

( * ) Notice: Subject to any disclaimer, the term of this patent is extended or adjusted under 35 U.S.C. 154(b) by 704 days.

(21) Appl. No.: 12/579,262

(22) Filed: Oct. 14, 2009

(65) Prior Publication Data

US 2011/0084747 A1  Apr. 14, 2011

(51) Int. Cl.
*G05F 1/613* (2006.01)
*H03K 7/08* (2006.01)

(52) U.S. Cl.
CPC .................................... *H03K 7/08* (2013.01)
USPC ............................................... 323/282

(58) Field of Classification Search
USPC ................................................ 323/208–282
See application file for complete search history.

(56) References Cited

U.S. PATENT DOCUMENTS

| | | | | |
|---|---|---|---|---|
| 6,275,018 B1 * | 8/2001 | Telefus et al. | ............... | 323/282 |
| 7,626,370 B1 * | 12/2009 | Mei et al. | ............... | 323/282 |
| 7,638,993 B2 * | 12/2009 | Valentino | ............... | 323/282 |
| 7,800,351 B2 * | 9/2010 | Gan | ............... | 323/283 |
| 2008/0030183 A1 | 2/2008 | Valentino | ............... | 323/285 |

FOREIGN PATENT DOCUMENTS

TW  200742236  11/2007

* cited by examiner

*Primary Examiner* — Adolf Berhane
*Assistant Examiner* — Yemane Mehari
(74) *Attorney, Agent, or Firm* — Hayes Soloway P.C.

(57) ABSTRACT

A voltage converting circuit for converting an input voltage into an output voltage is disclosed. The voltage converting circuit includes a modulation signal generator, a comparator and a logic unit. The modulation signal generator is configured for generating a pulse width modulation (PWM) signal responsive to a feedback signal corresponding to the output voltage and a load coupled thereto. The comparator is configured for comparing the feedback signal with a reference signal to output a comparing signal. The logic unit is configured for performing a logical conjunction of the PWM signal and the comparing signal to generate a control signal for adjusting an input current corresponding to the input voltage to regulate the output voltage. A method for converting an input voltage into an output voltage is also disclosed herein.

14 Claims, 5 Drawing Sheets

VOLTAGE CONVERTING CIRCUIT AND METHOD

BACKGROUND

1. Technical Field

The present disclosure relates to a voltage converting circuit. More particularly, the present disclosure relates to a dual mode voltage converting circuit.

2. Description of Related Art

Conventionally, a voltage converting circuit is provided for supplying an output voltage with a regulated level from a DC voltage source. In practice, the converted output voltage may be higher or lower than the original DC voltage source.

The voltage converting circuit may be operated in a pulse frequency modulation (PFM) mode or a pulse width modulation (PWM) mode. However, when the voltage converting circuit is operated in the PFM mode, the voltage converting circuit in a heavy loading condition may suffer from generating the output voltage with a great ripple, such that the output voltage has poor performance.

SUMMARY

In accordance with one embodiment of the present invention, a voltage converting circuit for converting an input voltage into an output voltage is provided. The voltage converting circuit includes a modulation signal generator, a comparator and a logic unit. The modulation signal generator is configured for generating a pulse width modulation (PWM) signal responsive to a feedback signal corresponding to the output voltage and a load coupled thereto. The comparator is configured for comparing the feedback signal with a reference signal to output a comparing signal. The logic unit is configured for performing a logical conjunction of the PWM signal and the comparing signal to generate a control signal for adjusting an input current corresponding to the input voltage to regulate the output voltage.

In accordance with another embodiment of the present invention, a voltage converting circuit for converting an input voltage into an output voltage is provided. The voltage converting circuit includes a switching unit, a modulation signal generator, a comparator and a logic unit. The switching unit is switched on and off alternately to adjust an input current corresponding to the input voltage to regulate the output voltage. The modulation signal generator receives a feedback signal corresponding to the output voltage to generate a pulse width modulation (PWM) signal when the output voltage is different from a target voltage. The comparator receives and compares the feedback signal with a reference signal to generate a comparing signal when the output voltage is different from the target voltage. The logic unit is configured for performing a logical conjunction of the PWM signal and the comparing signal to generate a control signal for alternately switching on and off the switching unit.

In accordance with yet another embodiment of the present invention, a method for converting an input voltage into an output voltage is provided. The method includes the acts of: generating a feedback signal corresponding to the output voltage; generating a pulse width modulation (PWM) signal according to the feedback signal; comparing the feedback signal with a reference signal to generate a comparing signal; performing a logical conjunction of the PWM signal and the comparing signal to generate a control signal; and alternately switching on and off a switching unit with the control signal to adjust an input current corresponding to the input voltage to regulate the output voltage.

It is to be understood that both the foregoing general description and the following detailed description are by examples, and are intended to provide further explanation of the invention as claimed.

BRIEF DESCRIPTION OF THE DRAWINGS

The disclosure can be more fully understood by reading the following detailed description of the embodiments, with reference to the accompanying drawings as follows.

DESCRIPTION OF THE EMBODIMENTS

In the following detailed description, the embodiments of the present invention have been shown and described. As will be realized, the disclosure is capable of modification in various respects, all without departing from the disclosure. Accordingly, the drawings and description are to be regarded as illustrative in nature, and not restrictive.

Figure 1:
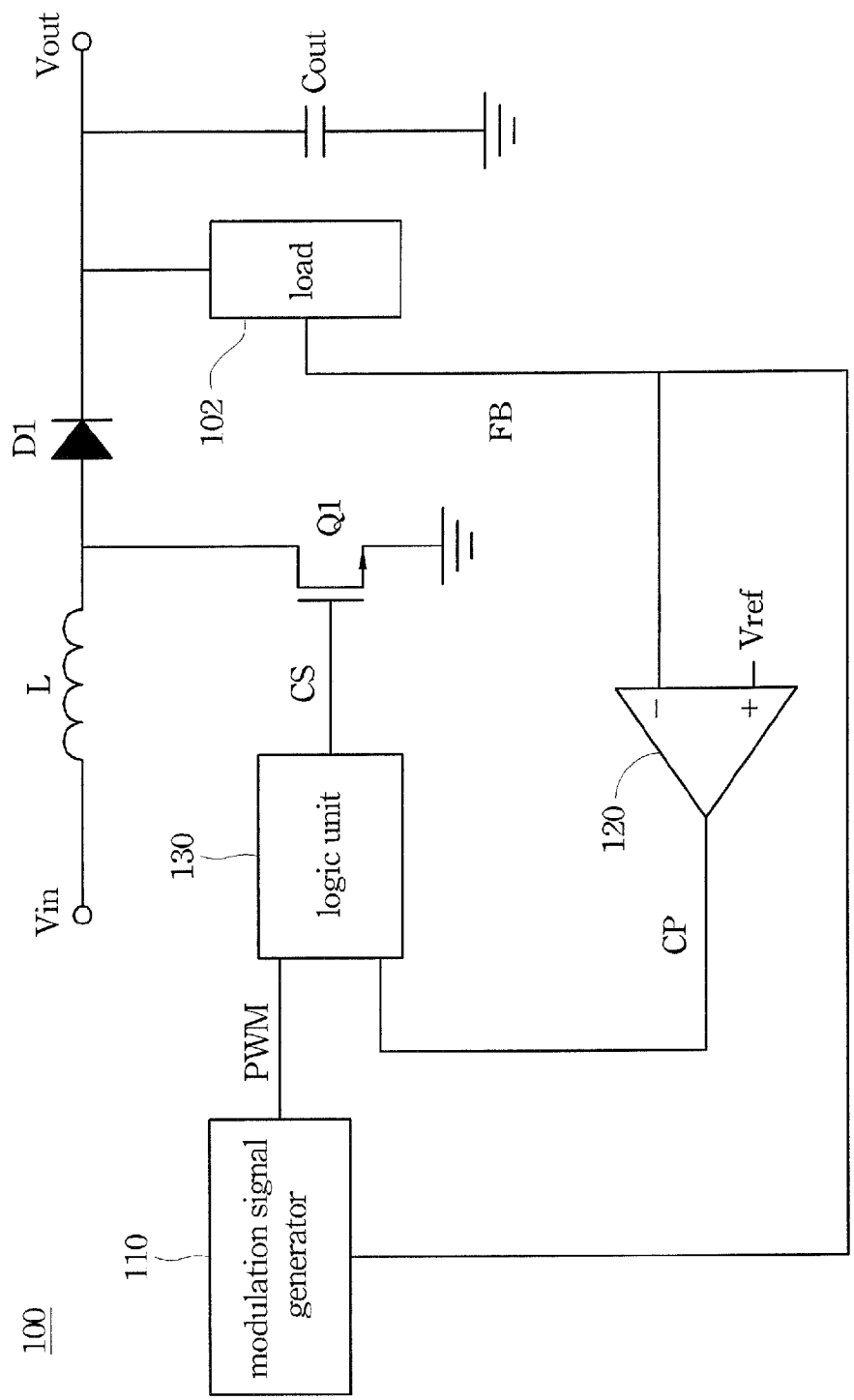
FIG. 1 illustrates a boost-type voltage converting circuit according to one embodiment of the present invention.

FIG. 1 illustrates a boost-type voltage converting circuit according to one embodiment of the present invention. The boost-type voltage converting circuit 100 converts an input voltage Vin into an output voltage Vout with a regulated voltage level by appropriately controlling an input current, in which the input current corresponds to the input voltage Vin and flows through an inductance L coupled between the input voltage Vin and the output voltage Vout.

The voltage converting circuit 100 includes a switching unit (e.g. power switch transistor Q1), a modulation signal generator 110, a comparator 120 and a logic unit 130. The modulation signal generator 110 receives a feedback signal FB corresponding to the output voltage Vout and a load 102 coupled thereto to generate a pulse width modulation (PWM) signal. In one embodiment, when the output voltage Vout is different from a target voltage which is to be applied in other devices, the modulation signal generator 110 receives the feedback signal FB to generate the PWM signal. Moreover, the feedback signal FB may be a feedback voltage converted from the output voltage Vout through the load 102.

The comparator 120 receives and compares the feedback signal FB with a reference signal Vref (e.g. reference voltage) to generate a comparing signal CP. In one embodiment, the feedback signal FB may be transmitted to the comparator 120 when the output voltage Vout is different from the target voltage.

The logic unit 130 performs a logical conjunction of the PWM signal and the comparing signal CP to generate a control signal CS. Then, the power switch transistor Q1 can thus be switched on and off alternately by the control signal CS to adjust the input current flowing through the inductance L, so as to regulate the output voltage Vout.

In addition, the PWM signal generated by the modulation signal generator 110 may vary along with the load 102 coupled to the output voltage Vout or along with the feedback signal FB corresponding to the load 102. In one embodiment, when the load 102 has a real-time change to a relatively light load, pulse widths of the PWM signal decrease; on the other hand, when the load 102 has a real-time change to a relatively heavy load, the pulse widths of the PWM signal increase.

When the load 102 is a relatively light load, the control signal CS generated by the logic unit 130 may vary along with the PWM signal and the comparing signal CP and thus substantially have a constant pulse width with modulated frequency. At this moment, the voltage converting circuit 100 can be deemed operating in a pulse frequency modulation (PFM) mode.

On the other hand, when the load 102 is a relatively heavy load, the control signal CS may have a constant duty cycle (or constant frequency) with modulated pulse widths. At this moment, the voltage converting circuit 100 can be deemed operating in the PWM mode.

In operation, when the load 102 changes from the relatively heavy load to the relatively light load (e.g. active mode switched to sleep mode of device), the PWM signal and the comparing signal CP would vary according to the feedback signal FB, such that the control signal CS varies accordingly from having a substantially constant duty cycle to having a substantially constant pulse width, and the voltage converting circuit 100 is thus deemed operating in the PFM mode.

Then, when the load 102 changes from the relatively light load back to the relatively heavy load (e.g. sleep mode switched to active mode of device), the PWM signal and the comparing signal CP would vary according to the feedback signal FB again, such that the control signal CS varies accordingly from having the substantially constant pulse width back to having the substantially constant duty cycle, and the voltage converting circuit 100 is thus deemed operating in the PWM mode.

Since a typical voltage converting circuit in the PFM mode usually utilizes a constant clock signal for operation, the voltage converting circuit thus suffers from generating the output voltage with ripples in a heavy loading condition. In contrast, according to the embodiment of the present invention, the aforementioned voltage converting circuit utilizes the PWM signal which is deemed a variable clock signal, for operation in the heavy loading condition. As a result, the voltage converting circuit can thus generate the output voltage with fewer ripples in the heavy loading condition.

Figure 2A:
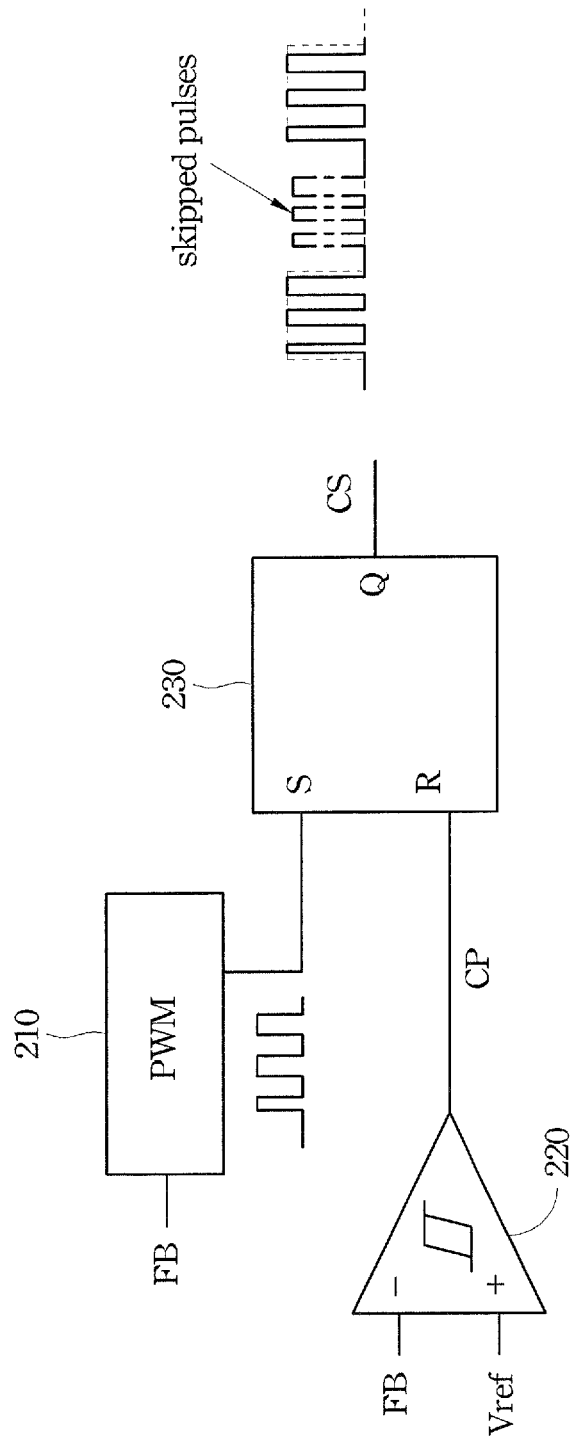
FIG. 2A illustrates a local circuit of the voltage converting circuit shown in FIG. 1 according to one embodiment of the present invention.

FIG. 2A illustrates a local circuit of the voltage converting circuit shown in FIG. 1 according to one embodiment of the present invention. Referring to FIG. 1 and FIG. 2A, the modulation signal generator 110 further includes a PWM signal generator 210 for generating the PWM signal, the comparator 120 may be a hysteresis comparator, and the logic unit 130 further includes an SR latch 230 having a set input (S) for receiving the PWM signal, a reset input (R) for receiving the comparing signal CP and an output (Q) for outputting the control signal CS. After the PWM signal and the comparing signal CP are generated, the SR latch 230 performs the logical conjunction of the PWM signal and the comparing signal CP and thus generates the control signal CS, in which original pulses of the PWM signal may be skipped due to the logical conjunction.

Figure 2B:
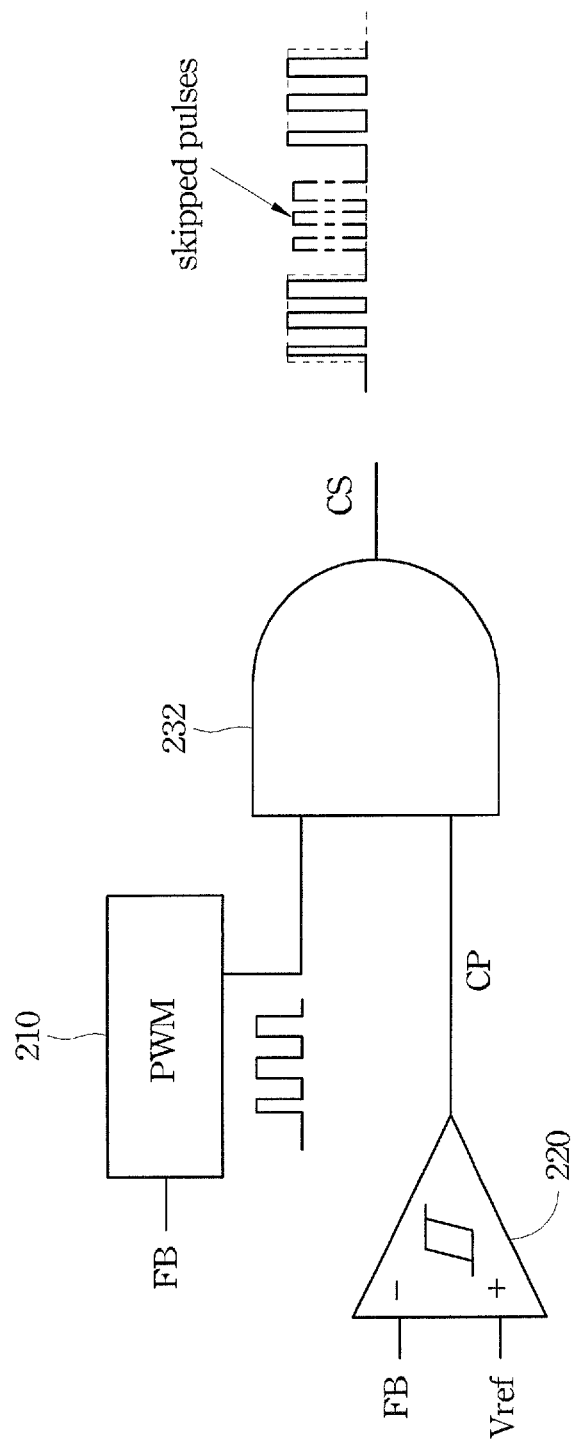
FIG. 2B illustrates a local circuit of the voltage converting circuit shown in FIG. 1 according to another embodiment of the present invention.

FIG. 2B illustrates a local circuit of the voltage converting circuit shown in FIG. 1 according to another embodiment of the present invention. Compared to FIG. 2A, the logic unit 130 includes an AND operator 232 for performing AND operation of the PWM signal and the comparing signal CP to output the control signal CS.

Moreover, the PWM signal generator 210 mentioned above can further include an error amplifier (not shown) and a comparator (not shown), in which the error amplifier is configured for detecting an error between the feedback signal FB and another reference voltage to generate an error signal with respect to the error, and the comparator is configured for comparing the error signal with an oscillating signal to generate the PWM signal.

Figure 3:
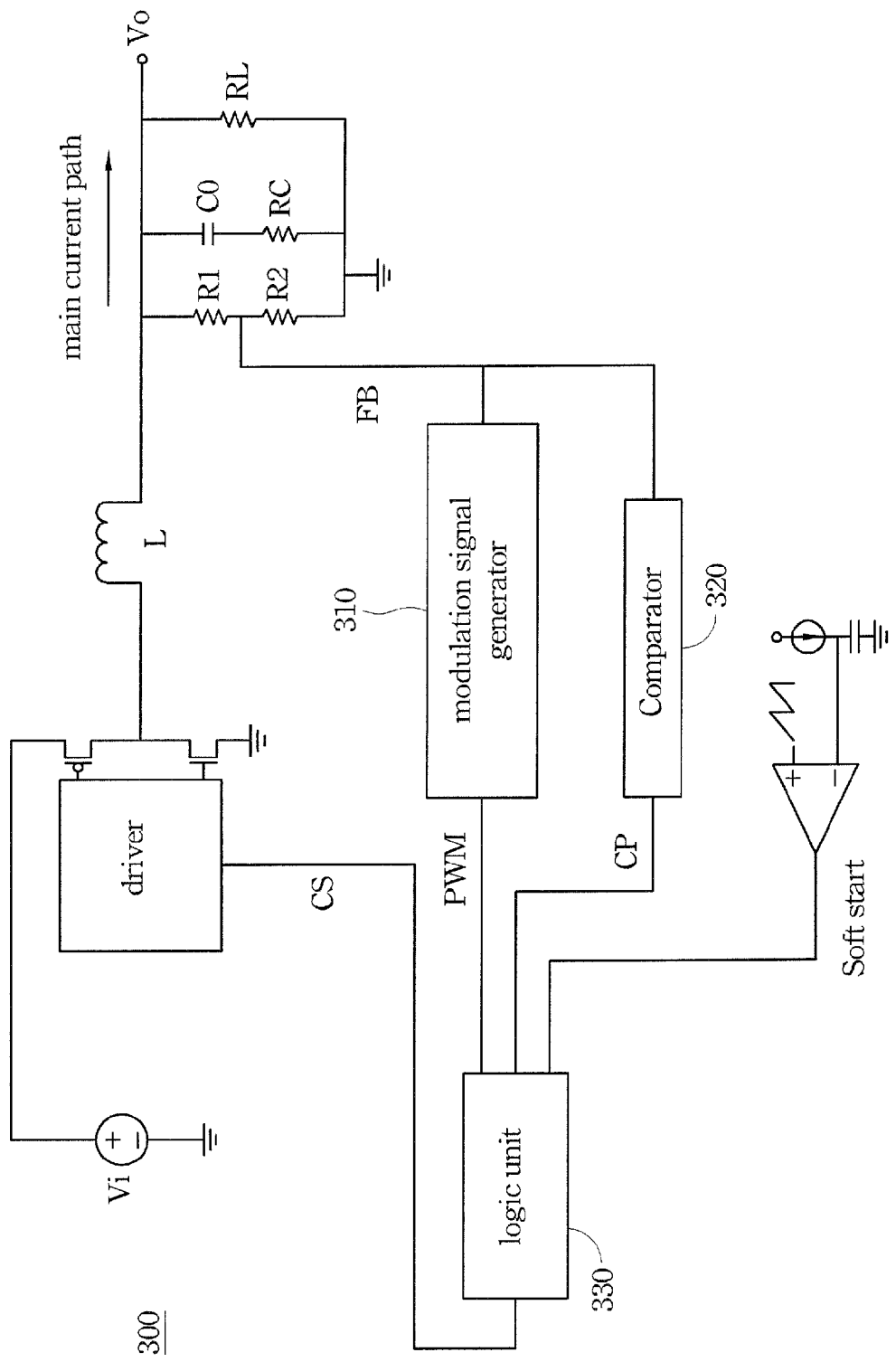
FIG. 3 illustrates a buck-type voltage converting circuit according to one embodiment of the present invention.

FIG. 3 illustrates a buck-type voltage converting circuit according to one embodiment of the present invention. Compared to the boost-type voltage converting circuit 100 in FIG. 1, the buck-type voltage converting circuit 300 also includes a modulation signal generator 310, a comparator 320 and a logic unit 330, which are all similar to those mentioned in FIG. 1 and FIGS. 2A and 2B.

Figure 4:
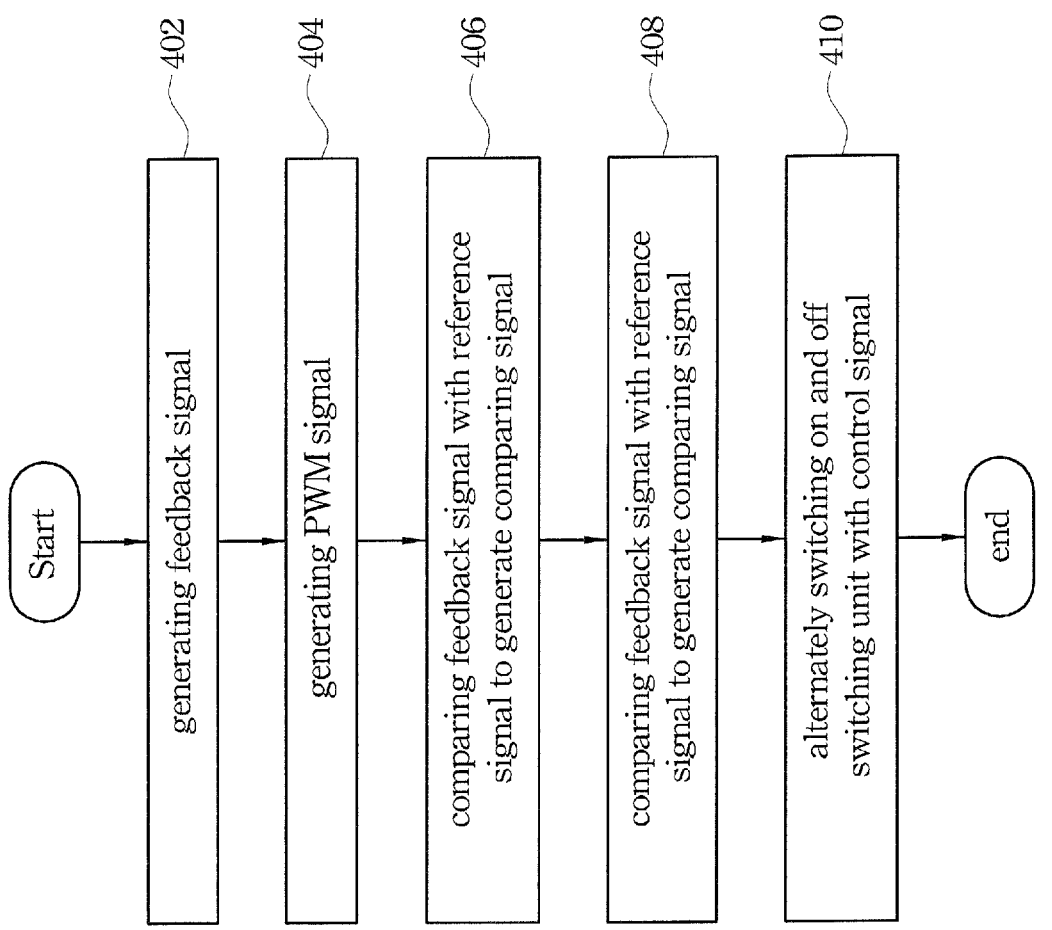
FIG. 4 illustrates a flowchart of a method for converting an input voltage into an output voltage according to one embodiment of the present invention.

FIG. 4 illustrates a flowchart of a method for converting an input voltage into an output voltage according to one embodiment of the present invention. Refer to both FIG. 1 and FIG. 4. First, the feedback signal FB corresponding to the output voltage Vout is generated (step 402). Then, the PWM signal is generated according to the feedback signal FB (step 404) by the modulation signal generator 110. Thereafter, the feedback signal FB is compared with the reference signal Vref to generate the comparing signal CP (step 406) by the comparator 120. A logical conjunction of the PWM signal and the comparing signal CP are then performed to generate the control signal CS (step 408) by the logic unit 130. After that, the switching unit (e.g. power switch transistor Q1) is alternately switched on and off to adjust the input current corresponding to the input voltage Vin to regulate the output voltage Vout (step 410).

In one embodiment, the PWM signal varies when the load 102 coupled to the output voltage Vout changes. Specifically, when the load 102 has a real-time change to a relatively light load, pulse widths of the PWM signal decrease; on the other hand, when the load 102 has a real-time change to a relatively heavy load, the pulse widths of the PWM signal increase.

In addition, when the load 102 is a relatively light load, the control signal CS may vary along with the PWM signal and the comparing signal CP and thus substantially have a constant pulse width with modulated frequency to be deemed operating in the PFM mode. On the other hand, when the load 102 is a relatively heavy load, the control signal CS may have a constant duty cycle with modulated pulse widths to be deemed operating in the PWM mode.

Furthermore, when the load 102 changes from a relatively heavy load to a relatively light load, the PWM signal and the comparing signal CS would vary according to the feedback signal FB, such that the control signal CS varies accordingly from having a substantially constant duty cycle to having a substantially constant pulse width. Then, when the load 102 changes from the relatively light load back to the relatively heavy load, the PWM signal and the comparing signal CS would vary according to the feedback signal FB again, such that the control signal CS varies accordingly from having the substantially constant pulse width back to having the substantially constant duty cycle.

As is understood by a person skilled in the art, the foregoing embodiments of the present invention are illustrative of the present invention rather than limiting of the present invention. It is intended to cover various modifications and similar arrangements included within the spirit and scope of the appended claims, the scope of which should be accorded with the broadest interpretation so as to encompass all such modifications and similar structures.

What is claimed is:

1. A voltage converting circuit for converting an input voltage into an output voltage, the voltage converting circuit comprising:

a modulation signal generator for generating a pulse width modulation (PWM) signal responsive to a feedback signal corresponding to the output voltage and a load coupled thereto;

a comparator for comparing the feedback signal with a reference signal to output a comparing signal; and a logic unit for performing a logical conjunction of the PWM signal and the comparing signal to generate a control signal for adjusting an input current corresponding to the input voltage to regulate the output voltage;

wherein when the load is changed from a relatively light load to a relatively heavy load, pulse widths of the PWM signal generated by the modulation signal generator are increased according to the fact that the load is changed from the relatively light load to the relatively heavy load, and the control signal generated by the logic unit is varied to substantially have a constant duty cycle according to the increased pulse widths of the PWM signal.

2. The voltage converting circuit as claimed in claim 1, wherein the logic unit further comprises:
an SR latch having a first input for receiving the PWM signal, a second input for receiving the comparing signal and an output for outputting the control signal.

3. The voltage converting circuit as claimed in claim 1, wherein the logic unit further comprises:
an AND operator for performing AND operation of the PWM signal and the comparing signal to output the control signal.

4. The voltage converting circuit as claimed in claim 1, wherein the comparator is a hysteresis comparator.

5. A voltage converting circuit for converting an input voltage into an output voltage, the voltage converting circuit comprising:
a switching unit switched on and off alternately to adjust an input current corresponding to the input voltage to regulate the output voltage;

a modulation signal generator receiving a feedback signal corresponding to the output voltage and a load coupled thereto to generate a pulse width modulation (PWM) signal when the output voltage is different from a target voltage;

a comparator receiving and comparing the feedback signal with a reference signal to generate a comparing signal when the output voltage is different from the target voltage; and a logic unit for performing a logical conjunction of the PWM signal and the comparing signal to generate a control signal for alternately switching on and off the switching unit;

wherein when the load is changed from a relatively light load to a relatively heavy load, pulse widths of the PWM signal generated by the modulation signal generator are increased according to the fact that the load is changed from the relatively light load to the relatively heavy load, and the control signal generated by the logic unit is varied to substantially have a constant duty cycle according to the increased pulse widths of the PWM signal.

6. The voltage converting circuit as claimed in claim 5, wherein when the load changes from a relatively heavy load to a relatively light load, the control signal generated by the logic unit varies along with the PWM signal from having a substantially constant duty cycle to having a substantially constant pulse width.

7. The voltage converting circuit as claimed in claim 6, wherein when the load changes from the relatively light load to the relatively heavy load, the control signal varies from having the substantially constant pulse width to having the substantially constant duty cycle.

8. The voltage converting circuit as claimed in claim 5, wherein pulse widths of the PWM signal decrease when the load changes to a relatively light load.

9. The voltage converting circuit as claimed in claim 5, wherein the logic unit further comprises:
an SR latch having a set input for receiving the PWM signal, a reset input for receiving the comparing signal and an output for outputting the control signal.

10. The voltage converting circuit as claimed in claim 5, wherein the logic unit further comprises:
an AND operator for performing AND operation of the PWM signal and the comparing signal to output the control signal.

11. A method for converting an input voltage into an output voltage, comprising:
generating a feedback signal corresponding to the output voltage;

generating a pulse width modulation (PWM) signal according to the feedback signal by a modulation signal generator;

comparing the feedback signal with a reference signal to generate a comparing signal;

performing a logical conjunction of the PWM signal and the comparing signal to generate a control signal; and alternately switching on and off a switching unit with the control signal to adjust an input current corresponding to the input voltage to regulate the output voltage;

wherein when a load coupled to the output voltage changes from a relatively light load to a relatively heavy load, pulse widths of the PWM signal are increased according to the fact that the load is changed from a relatively light load to a relatively heavy load, and the control signal varies from having a substantially constant pulse width to having a substantially constant duty cycle according to the increased pulse widths of the PWM signal.

12. The method as claimed in claim 11, wherein when a load coupled to the output voltage changes from a relatively heavy load to a relatively light load, the control signal varies according to the load from having a substantially constant duty cycle to having a substantially constant pulse width.

13. The method as claimed in claim 11, wherein the control signal substantially has a constant pulse width.

14. The method as claimed in claim 11, wherein the control signal substantially has a constant duty cycle.

* * * * *